United States Patent [19]
Sumi

[11] Patent Number: 6,140,229
[45] Date of Patent: Oct. 31, 2000

[54] SEMICONDUCTOR APPARATUS AND METHOD OF PRODUCING SAME

[75] Inventor: Hirofumi Sumi, Kanagawa, Japan

[73] Assignee: Sony Corporation, Tokyo, Japan

[21] Appl. No.: 09/027,149

[22] Filed: Feb. 20, 1998

Related U.S. Application Data

[62] Division of application No. 08/531,787, Sep. 21, 1995, Pat. No. 5,763,948.

[30] Foreign Application Priority Data

Sep. 22, 1994 [JP] Japan .................................. 6-227582

[51] Int. Cl.$^7$ ..................................................... H01L 21/44
[52] U.S. Cl. ............................................. 438/653; 438/657
[58] Field of Search ...................................... 438/652, 653, 438/657

[56] References Cited

U.S. PATENT DOCUMENTS

| | | | |
|---|---|---|---|
| 5,340,459 | 8/1994 | Takehara | 204/298.07 |
| 5,439,574 | 8/1995 | Kobayashi et al. | 204/192.12 |
| 5,581,125 | 12/1996 | Maeda | 257/767 |

*Primary Examiner*—Brian Dutton
*Attorney, Agent, or Firm*—Hill & Simpson

[57] ABSTRACT

A semiconductor apparatus having at least a compound film containing nitrogen and a method for production of the same, wherein the compound film containing nitrogen is formed under conditions where the ratio of the flow rates of the nitrogen with respect to an inert gas is 0.125 to 1.0.

20 Claims, 9 Drawing Sheets

FWMH OF TiN(III) LATTICE

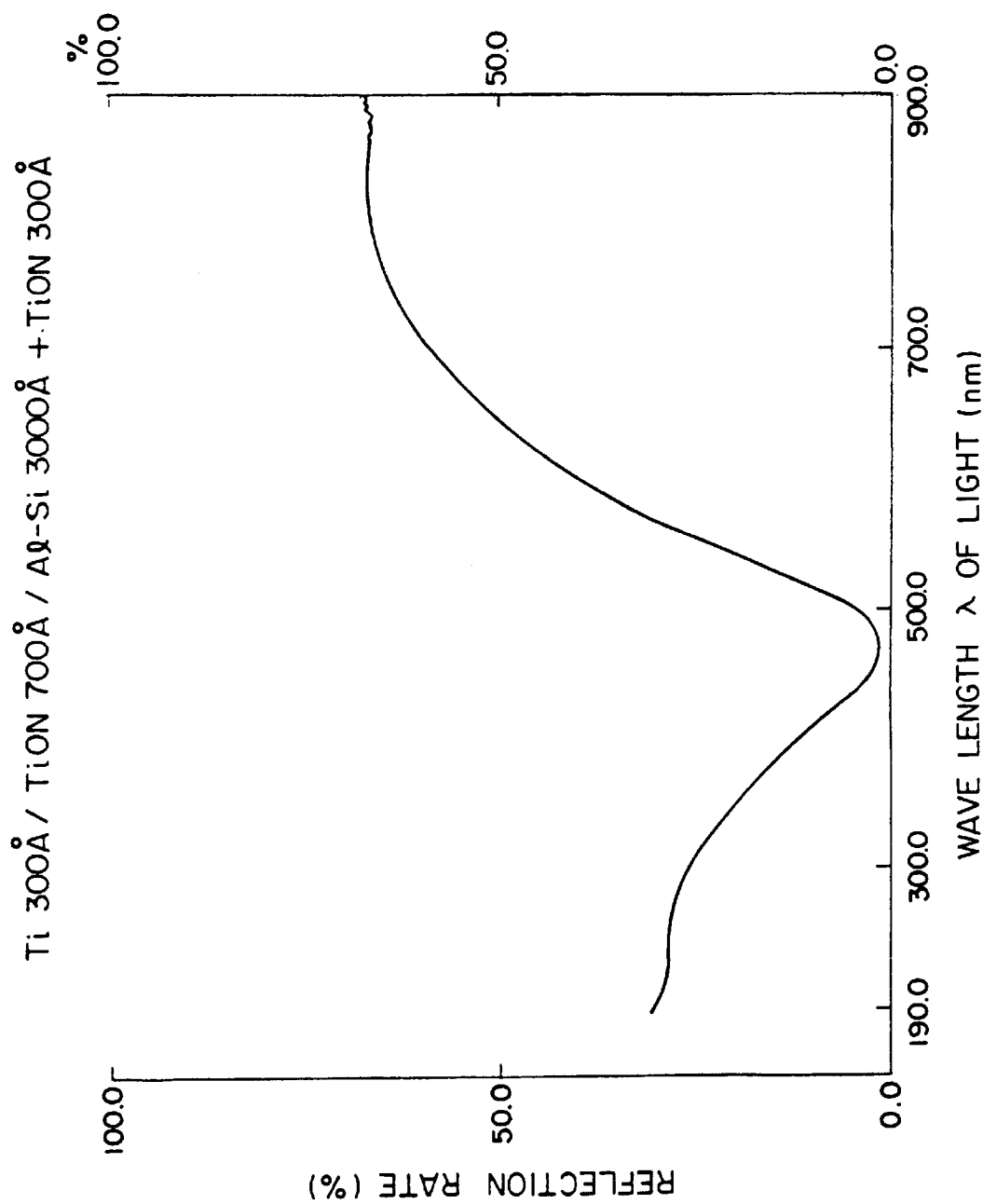

SEMICONDUCTOR APPARATUS AND METHOD OF PRODUCING SAME

This application is a division of application Ser. No. 08/531,787, filed Sep. 21, 1995, now U.S. Pat. No. 5,763,948.

BACKGROUND OF THE INVENTION

1. Field of the Invention

The present invention relates to A semiconductor apparatus and a method of producing the same, more particularly, relates to a compound film containing nitrogen (for example, a TiN film) used for example as a barrier film in a contact portion between an interconnection layer and a semiconductor or a contact portion between one interconnection layer and another interconnection layer.

2. Description of the Related Art

The increasing miniaturization of semiconductor devices has led to greater demands on the reliability of interconnections. Particularly, the metal using for forming a film so as to give an ohmic-contact with respect to a shallow junction of a transistor and the underlying silicon (Si) are brought into close contact by a boundary reaction so as to give a good electrical connection. If the reaction is excessively advanced, however, the metal penetrates through the shallow junction portion to cause a large junction leakage. Conversely, if the reaction is insufficient, there is a problem in that the ohmic-contact is not obtained and therefore the electrical characteristics become unstable.

Here, an example of a process for producing a conventional metal oxide semiconductor (MOS) large-scale integrated circuit (LSI) will be explained with reference to FIGS. 1A to 1C.

(a) As shown in FIG. 1A, an element isolation region (LOCOS) 4, a gate insulation film 6, a gate electrode 8. and a source-drain region 10 are formed on the surface of a semiconductor substrate 2 to form an MOS transistor.

(b) Next, as shown in FIG. 1B, an interlayer insulation film 12 is formed on the MOS transistor, and a contact hole 14 is formed in this.

(c) Next, as shown in FIG. 1C, blanket tungsten 16 or the like is filled in the contact hole 14. Further, a film of an aluminum (Al)-based alloy 17 such as Al—Si is formed on this and subjected to patterning so as to form an interconnection region.

While the element is formed by the example of the production process described in the above steps (a) to (c), the interconnections and the silicon substrate (Si) have been connected using a laminate structure of silicon nitride and titanium (TiN/Ti). However, if the reaction of the Ti is insufficient, a good ohmic-contact is not obtained and a problem occurs.

As a method of keeping the reaction between the interconnection metal and the underlying silicon from being obstructed, use has been made of a TiN film. By forming a TiN film with a good barrier property, the contact characteristics can be stabilized. However, it has been not been possible to control the change in the film quality with respect to the parameters of the method of forming the TiN film. Therefore, at the present time, it is not possible to produce a device with the best film quality.

Also, recently, a technique of forming a film of TiN by collimate sputtering has been developed. Collimate sputtering is a technique where a collimate is disposed between the target of the sputtering apparatus and the wafer and sputtering particles of an oblique direction are made to deposit on it, whereby only particles in the vertical direction and in directions close to this are taken out, thereby improving the bottom coverage rate of the contact holes.

In this collimate sputtering, generally, the flow rate of the nitrogen gas with respect to the argon gas was as high as 1.5 or more. Also, in this collimate sputtering, it was impossible to control the changes in the film quality with respect to the parameters of the method of forming the TiN film. Therefore, at the present time, it is not possible to prepare a device with the best film quality.

SUMMARY OF THE INVENTION

An object of the present invention is to provide a structure and a method of producing a film suitable for use as a barrier film or the like used as a film underlying an interconnection layer.

The present invention provides a method of production which enables control of the reactivity with the underlying silicon and control of the direction of an interconnection metal on the TiN (controlling the direction of the interconnection metal enabling improvement of the electrical migration, that is, the reliability of interconnections) and a connection structure using the same.

It has been known that the reaction for forming $TiSi_2$ depends strongly upon the crystal lattice direction of the titanium formed. In the case where the Ti formed has a (002) lattice direction, it has been confirmed by experiments that the reactivity with the underlying silicon becomes strong.

Therefore, the present invention adopts as a contact structure a structure wherein Ti of a (002) lattice direction having a strong reactivity is connected to the silicon so as to enable control of the parameter of the film thickness of the Ti (002) crystal and control of the film thickness of the silicide formed.

As the method of controlling the Ti (002) lattice direction, there are the methods of changing the sputtering power, bias sputtering, etc. in this method of production, various types of contact structures can be obtained by continuously changing the power during the sputtering. FIG. 5 shows the Ti and TiN which are easily oriented.

Also, it is clear that it is possible to control the quality of the TiN film formed by controlling the flow rate of the nitrogen gas in the sputtering gas as the method of controlling the direction of the Ti.

The present inventor examined the resistivity and density of TiN by varying the flow rate of the nitrogen gas with respect to the flow rate of the argon gas and consequently found that the resistivity and density of the TiN film changed together with the change of the flow rate of nitrogen as shown in FIG. 2. FIG. 3 is a view of the results of a similar examination of the dependency of the speed of film formation on the flow rate of the nitrogen gas. From these states, a mode where the nitrogen flow rate is 20 sccm or less ($N_2/Ar \leq 0.5$) is called a metallic mode, and a mode where it is 30 sccm or more ($N_2/Ar \geq 0.75$) is called a nitride mode. It is seen that, in the case of the metallic mode, not only is the resistivity low and the film density high, but also, as shown in FIG. 4, the crystals are strongly oriented in the TiN (111) since the half-value width of the TiN (111) lattice direction is narrow as seen from the results of X-ray diffraction analysis (XRD). Moreover, it was confirmed that the composition was one where the titanium and nitrogen were closer to the stoichiometric state (it can be said that a state where the ratio of Ti and N is near 1.0 is TiN stoichiometrically).

A preferred aspect of the semiconductor apparatus according to the present invention will be shown below.

A semiconductor apparatus according to the present invention is a semiconductor apparatus having at least a compound film containing nitrogen. The aforesaid compound film containing the nitrogen is formed under conditions such that the ratio of the flow rates of the nitrogen with respect to the inert gas is from 0.125 to 1.0.

Preferably, the aforesaid compound film containing the nitrogen is formed by reactive sputtering or chemical vapor deposition (CVD).

Preferably, the aforesaid compound film containing the nitrogen is TiN, WN, MoN, ZrN, HfN, BN, CN, or oxides of any of these, further preferably, TiN.

Preferably, the aforesaid inert gas is an argon gas.

Preferably, the interconnection layer and the semiconductor of the semiconductor apparatus are electrically connected through the contact portion, and the underlying film disposed between the aforesaid interconnection layer and the semiconductor contains at least the aforesaid compound film containing the nitrogen.

Preferably, the aforesaid compound film containing the nitrogen acts as a barrier film in the aforesaid contact portion.

Preferably, the aforesaid underlying film has a Ti film in contact with the semiconductor and a TiN film laminated on this Ti film.

It is also possible to constitute the aforesaid underlying film by the Ti film in contact with the semiconductor, a first TiN film laminated on this Ti film, and a second TiN film laminated on this first TiN film and having different characteristics from those of the first TiN film.

Preferably, the crystal lattice direction of the aforesaid Ti film is (002) and the crystal lattice direction of the aforesaid first TiN film is (111).

It is also possible to constitute the aforesaid underlying film by a Ti film in contact with the semiconductor and having a crystal lattice direction of (002) and a TiN film laminated on this Ti film and having a crystal lattice direction of (111).

It is also possible to constitute the aforesaid underlying film by a Ti film in contact with the semiconductor and having a crystal lattice direction of (002), a TiN film laminated on this Ti film and having a crystal lattice direction of (111), and a TiON film laminated on this TiN film.

Preferably, a lower interconnection layer and an upper interconnection layer of the semiconductor apparatus are electrically connected through the contact portion, laminate films are laminated on the aforesaid lower interconnection layer, and the laminate film contains at least the aforesaid compound film containing the nitrogen.

Preferably, the film positioned in the uppermost layer among the aforesaid laminate films acts as an anti-reflection film when subjecting the aforesaid lower layer interconnection to photolithography.

Preferably, the aforesaid laminate film has a TiN film in contact with the lower interconnection layer, and a TiON film laminated on the TiN film.

Preferably, the crystal lattice direction of the aforesaid TiN film is (111).

It is also possible to constitute the aforesaid laminate film by a Ti film in contact with the lower interconnection layer, a TiN film laminated on the Ti film, and a TiON film laminated on the TiN film.

Preferably, the crystal lattice direction of the aforesaid Ti film is (002) and the crystal lattice direction of the aforesaid TiN film is (111).

It is also possible to constitute the aforesaid laminate film by a Ti film in contact with the lower interconnection layer, a first TiN film laminated on the Ti film, and a TiN film laminated on the first TiN film and having different characteristics from those of the first TiN film.

When continuously forming the aforesaid first TiN film and second TiN film by the reactive sputtering, preferably the ratio of the flow rate of the nitrogen gas with respect to the inert gas is changed.

Preferably, the ratio of the flow rates of the nitrogen gas with respect to the inert gas at the time of formation of the aforesaid first TiN film is controlled to 0.7 or less, more preferably 0.5 or less, and the ratio of the flow rates of the nitrogen gas with respect to the inert gas at the time of formation of the aforesaid second TiN film is controlled to 0.75 or more, more preferably 1.0 or more.

The aforesaid TiON film can be formed by forming, by reactive sputtering, the aforesaid TiN film with a ratio of the flow rates of the nitrogen gas with respect to the inert gas of 1.0 to 0.125, and then changing the ratio of the flow rates of the nitrogen gas with respect to the inert gas to the larger side to form a rough TiN film, then exposing this rough TiN film to the atmosphere or a low vacuum atmosphere having a divided pressure of oxygen of 0.1 Pa or more so as to change the rough TiN film to a TiON film.

It is also possible to form the aforesaid TiON film by reactive sputtering using the nitrogen gas, oxygen gas, and inert gas.

BRIEF DESCRIPTION OF THE DRAWINGS

These and other objects and features of the present invention will become clear from the following description the preferred embodiments made with reference to the accompanying drawings, in which

FIG. 9 shows the relationship of the reflection rate and the wavelength of light.

DESCRIPTION OF THE PREFERRED EMBODIMENTS

Below, embodiments of the present invention will be explained in detail using the drawings.

First, an explanation will be made of the first embodiment of the present invention.

The present embodiment is a method for controlling the gas flow rate. First, use is made of a magnetron sputtering apparatus having a Ti target. Argon is passed to form a film having a Ti (002) lattice direction. Thereafter, the nitrogen is introduced to form a TiN film. At this time, a ratio of the flow rate of $Ar/N_2=40/20$ sccm is set. By this, a high density, stoichiometric TiN film having a TiN (111) lattice direction can be formed.

Below, a detailed explanation will be made of an embodiment wherein the present invention is applied to the MOS device process with reference to the drawings.

Figure 6A:
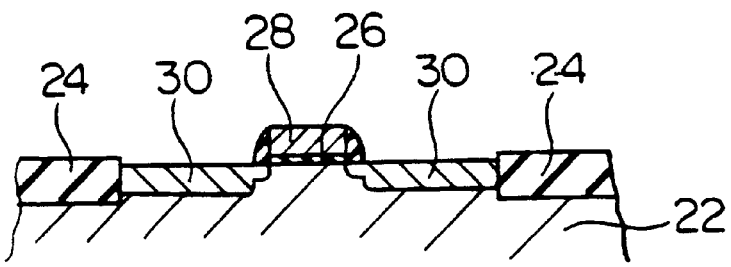
FIGS. 6A to 6D show an example of a process for producing a metal oxide semiconductor (MOS) device according to the present invention.

(a) As shown in FIG. 6A, a MOS transistor is formed on the surface of a semiconductor substrate 22 by forming an element isolation region (LOCOS) 24, a gate insulation film 26, a gate electrode 28 and a source-drain region 30.

Figure 6B:
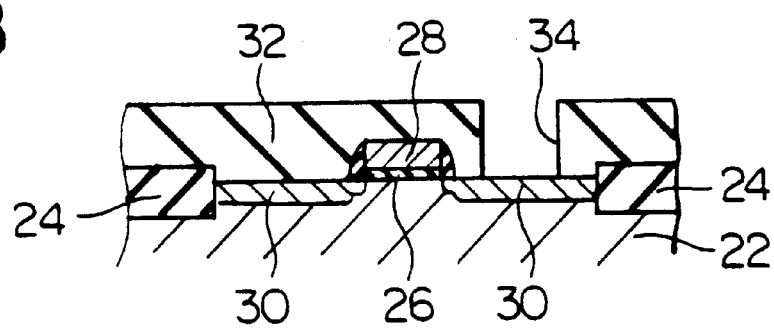

(b) Next, as shown in FIG. 6B, an interlayer insulation film 32 constituted by for example $SiO_2$ is formed.

An example of the conditions for formation of the interlayer insulation film 32 by CVD will be shown next.

EXAMPLE 1

Gas TEOS=50 sccm

Temperature: 720° C.

Pressure: 40 Pa

Film thickness: 600 nm

After forming the interlayer insulation-film 32, resist patterning is carried out to form a contact hole 34.

An example of the etching conditions for forming the contact hole 34 will be shown next.

EXAMPLE 2

Gas $C_4F_8$=50 sccm

RP power: 1200 W

Figure 6C:
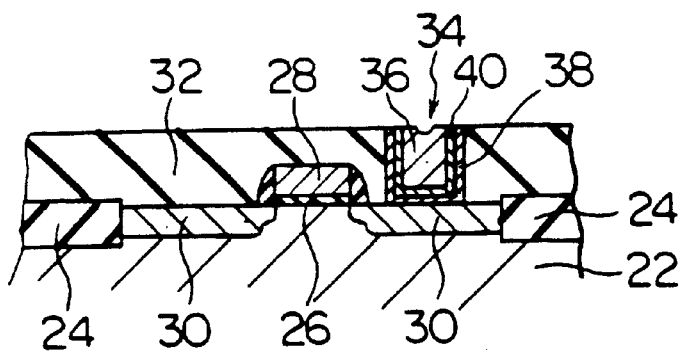

Pressure: 2 Pa (c) Next, an interconnection material is formed as shown in FIG. 6C.

The contact hole 34 is filled with blanket tungsten (W) 36.

First, the TiN/Ti, which is the tungsten-close contact layer (tungsten-underlying film), is formed.

An example of the conditions for forming the Ti film 38 by sputtering will be shown next.

EXAMPLE 3

Power: 8 kW

Film formation temperature: 150° C.

Ar: 100 sccm

Film thickness: 10 nm

Pressure: 0.47 Pa

Figure 5:
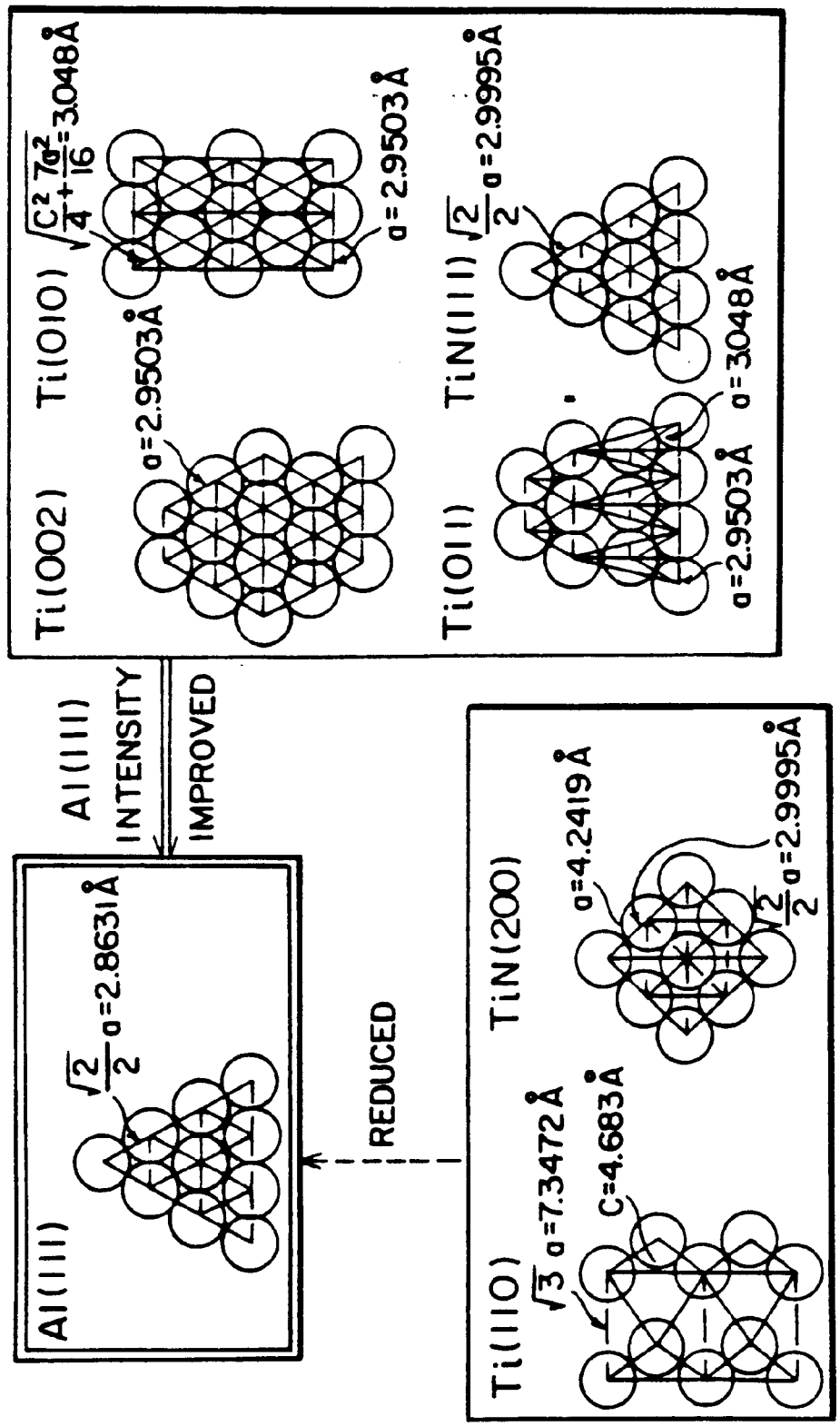
FIG. 5 shows Ti (002) lattice direction crystals.

Under these film formation conditions, the Ti (002) lattice direction crystal shown in FIG. 5 can be formed.

An example of the conditions for forming the TiN film 40 which is formed on the Ti film 38 by sputtering will be shown next.

EXAMPLE 4

Power: 5 kW

Gas $Ar/N_2$=40/20 sccm

Pressure: 0.47 Pa

Film thickness: 70 nm

Figure 1A:
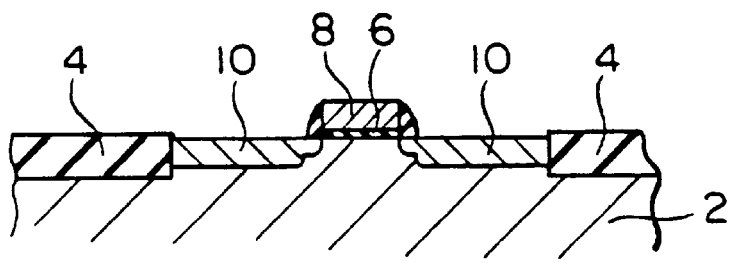
FIGS. 1A to 1C show an example of a process for producing a conventional metal oxide semiconductor (MOS) large-scale integrated circuit (LSI)
Figure 1B:
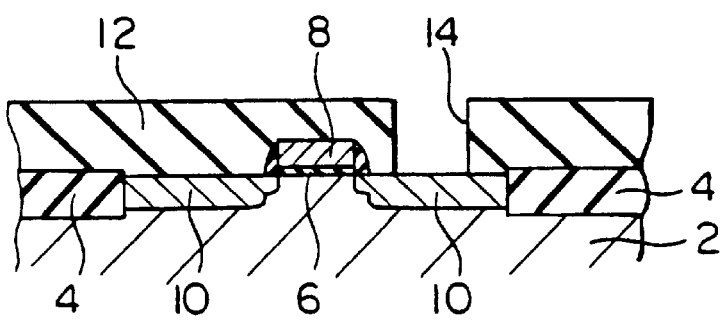
Figure 1C:
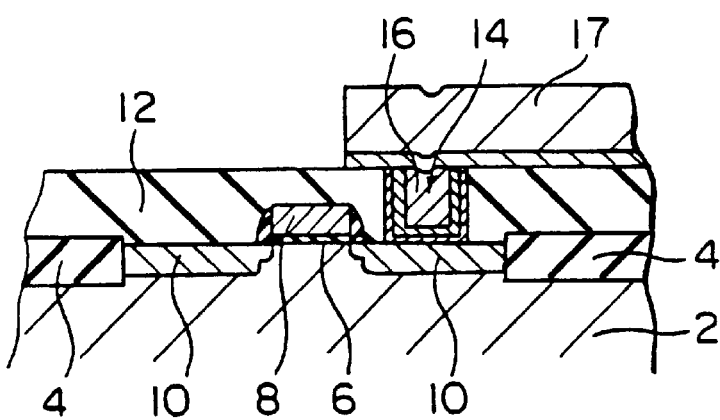
Figure 2:
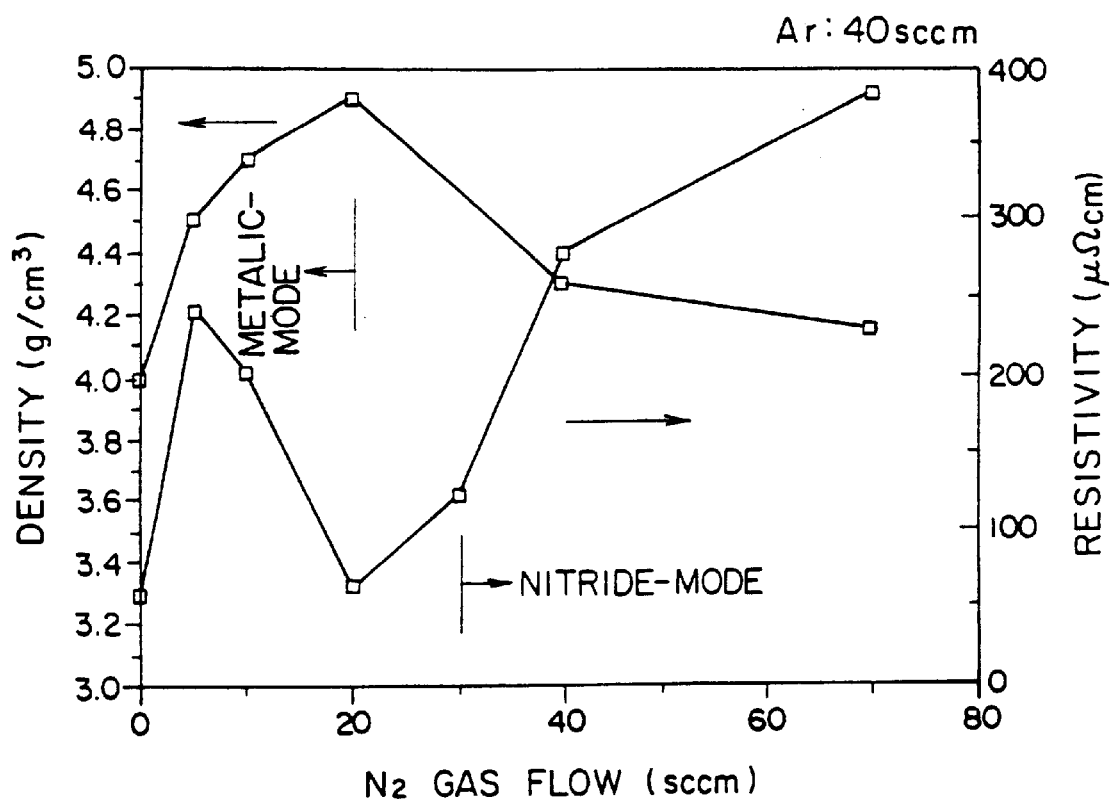
FIG. 2 shows the relationship between the resistivity and density of a TiN film and the change of the flow rate of nitrogen.
Figure 3:
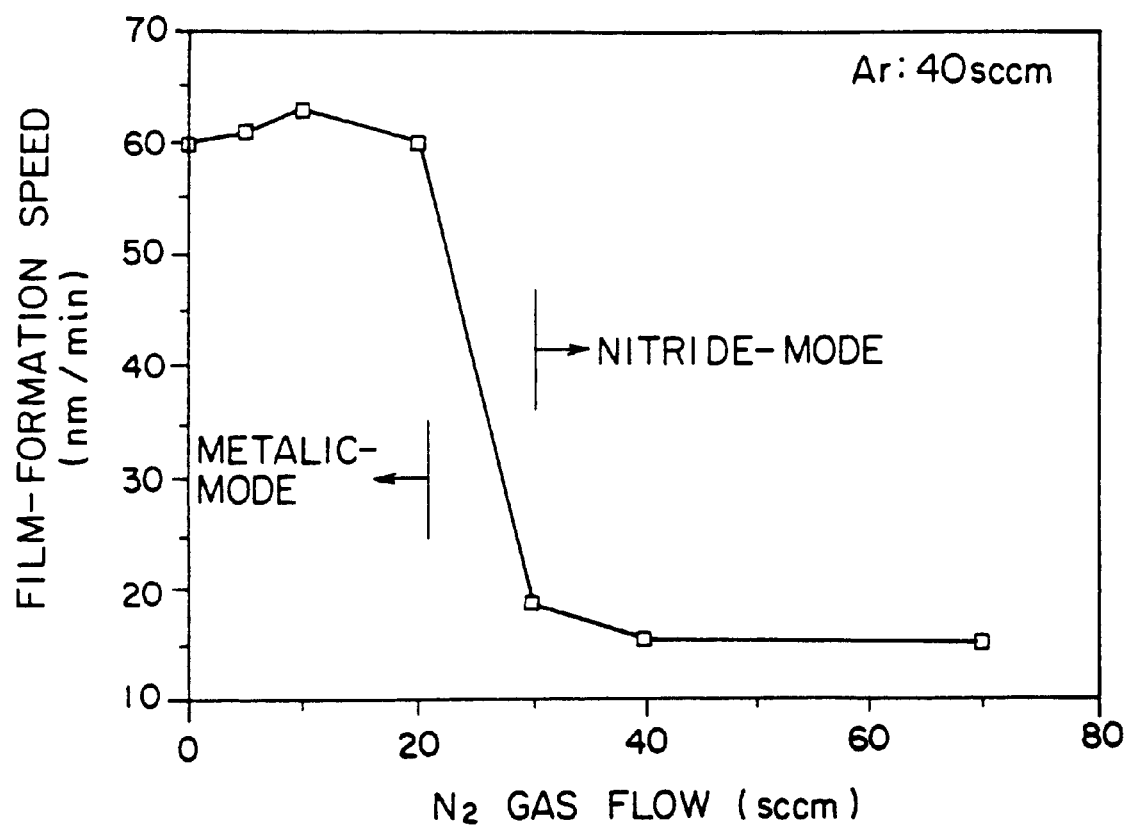
FIG. 3 shows the dependency of the speed of film formation on the flow rate of the nitrogen gas.
Figure 4:
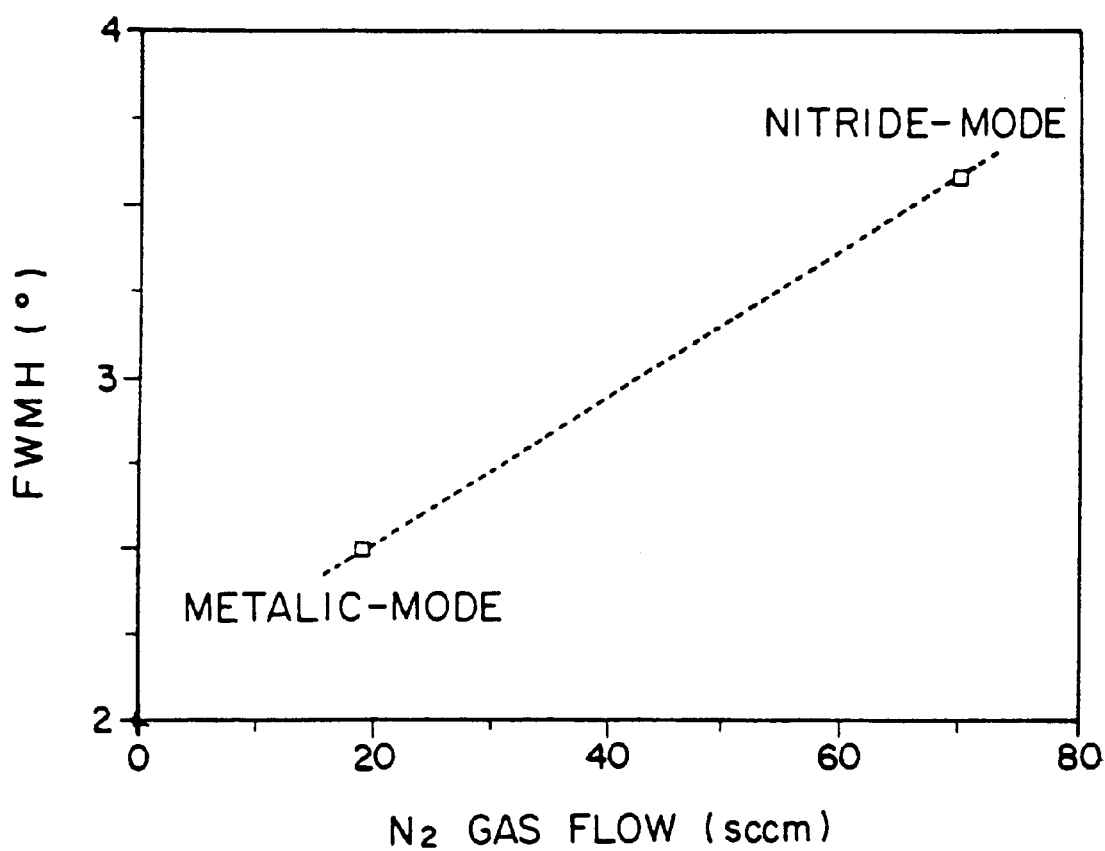
FIG. 4 shows the dependency of the FWMH of the TiN (111) lattice on the flow rate of the nitrogen gas.

The TiN film 40 formed under such conditions (ratio of the flow rates of $N_2$ with respect to Ar of about 0.5) has a lattice direction crystal (111) as shown in FIG. 5, and, as shown in FIG. 2, has a high density and low resistivity.

An example of the conditions for formation of the tungsten on the TiN film 40 by CVD will be shown next.

EXAMPLE 5

Gas $Ar/N_2/H_2/WF_6$=2200/300/500/75 sccm

Temperature: 450° C.

Pressure: 10640 Pa

Film thickness: 400 nm

Next, the tungsten is etched back, and a blanket tungsten 36 is formed. An example of the etching back conditions of the tungsten will be shown next.

EXAMPLE 6

Gas $SF_6$=50 sccm

RF power: 150 W

Figure 6D:
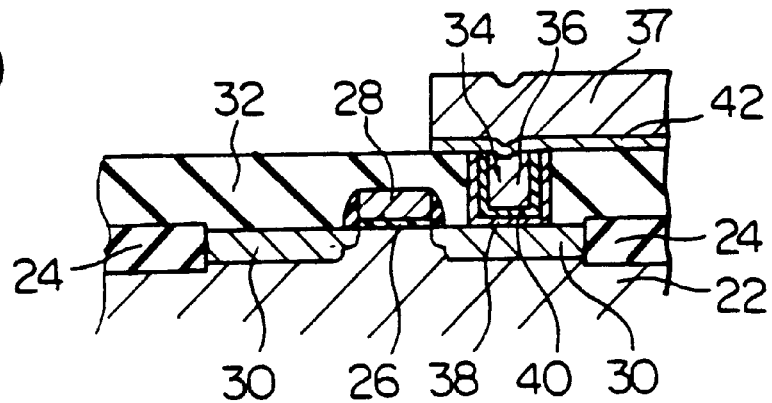

Pressure: 1.33 Pa (d) Next, as shown in FIG. 6D, the interconnection of Al/Ti is formed.

First, a Ti film 42 is formed. An example of the conditions for forming the Ti film 42 by sputtering will be shown next.

EXAMPLE 7

Power: 4 kW

Film formation temperature: 150° C.

Ar=100 sccm

Film thickness: 30 nm

Pressure: 0.47 Pa

Next, the Al film 37 is formed on the Ti film 42. An example of the conditions for forming the Al film 37 by sputtering will be shown next.

EXAMPLE 8

Power: 22.5 kW

Film formation temperature: 150° C.

Ar=50 sccm

Film thickness: 0.5 $\mu$m

Pressure: 0.47 Pa

Thereafter, an Al/Ti interconnection layer is formed by resist patterning and dry etching. An example of the etching conditions will be shown next.

EXAMPLE 9

Gas $BCl_3/Cl_2$=60/90 sccm

Microwave power: 100 W

RF power: 50 W

Pressure: 0.016 Pa

Next, an explanation will be made of a second embodiment of the present invention.

In the second embodiment, the same procedures as those for the first embodiment are carried out except the Ti film 38 and TiN film 40 of the first embodiment are formed by using collimate sputtering.

The following explanation will be made only of portions different from the first embodiment.

(c) TiN/Ti is formed. In this case, it is formed by a magnetron sputtering apparatus to which a collimate is attached.

First, the Ti film 38 is formed. An example of the conditions for forming the Ti film 38 will be shown next.

EXAMPLE 10

Power: 8 kw

Film formation temperature: 400° C.

Ar: 100 sccm

Film thickness: 20 nm

Pressure: 0.47 Pa

An example of the conditions for forming the TiN film 40 on the Ti film 38 will be shown next.

EXAMPLE 11

Power: 5 kW

Gas $Ar/N_2$=40/20 sccm

Pressure: 0.47 Pa

Film thickness: 100 nm

By performing the collimate sputtering method under such conditions, the TiN film 40 having a TiN (111) lattice direction shown in FIG. 5 is formed. This TiN film 40 has a high density and low resistivity as shown in FIG. 2.

Next, an explanation will be made of a third embodiment of the present invention.

Figure 7:
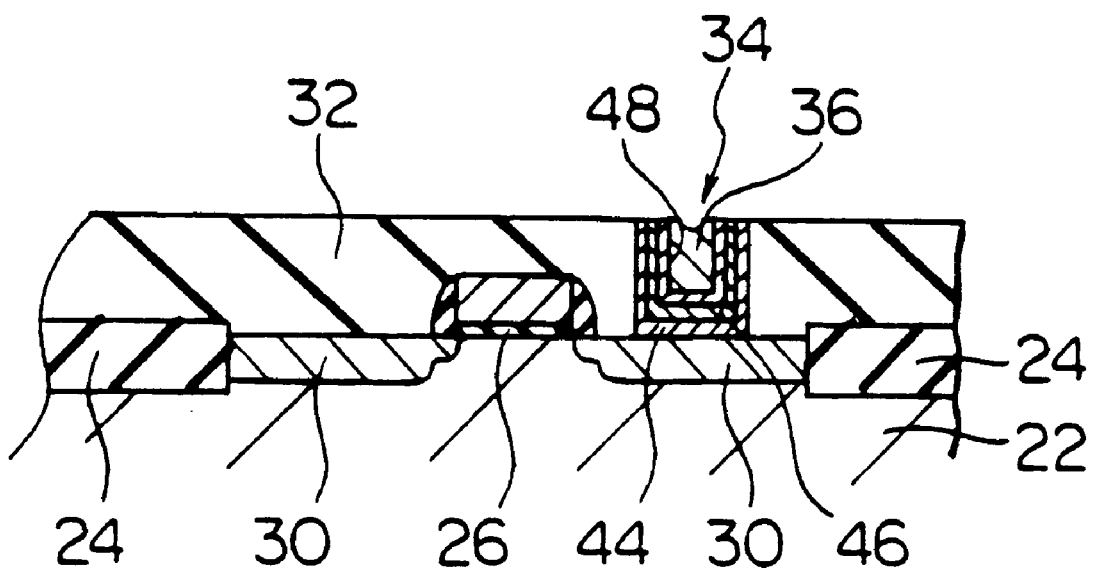
FIG. 7 shows an alternative step in the process for producing a metal oxide semiconductor (MOS) device according to the present invention.

The third embodiment is an embodiment similar to the aforesaid first embodiment except that the step shown in FIG. 6C is changed to the step shown in FIG. 7.

Explaining the third embodiment in brief, at the time of the formation of TiN, a high density TiN (111) crystal is formed in advance with $Ar/N_2$=40/20 sccm. Thereafter, it is continuously changed to $Ar/N_2$=40/70 sccm to form a rough TiN film. Oxygen is stacked on that part to make only the surface portion TiON and thereby give a double layer structure to the barrier metal.

The present embodiment will be explained in further detail below.

(c) TiN/Ti is formed.

First, as shown in FIG. 7, a Ti film 44 is formed. An example of the conditions for formation of the Ti film by sputtering will be shown next.

EXAMPLE 12

Power: 2 kw

Film formation temperature: 150° C.

Ar: 100 sccm

Film thickness: 20 nm

Pressure: 0.47 Pa

A TiN film 46 is formed on the Ti film 44. An example of the conditions for formation of the TiN film 46 by sputtering will be shown next.

EXAMPLE 13

Power: 5 kW

Gas $Ar/N_2$=40/20 sccm

Pressure: 0.47 Pa

Film thickness: 40 nm

Further, the ratio of the flow rates of the $Ar/N_2$ gas is continuously changed to form the TiN. An example of the conditions for formation of the film will be shown next.

EXAMPLE 14

Power: 5 kW

Gas $Ar/N_2$=40/70 sccm

Pressure: 0.47 Pa

Film thickness: 10 nm

The TiN film formed under these film formation conditions has a ratio of the flow rates of $Ar/N_2$=40/70 sccm, and therefore, as shown in FIG. 2, the density is low in comparison with the TiN film which is formed with a gas $Ar/N_2$=40/20 sccm.

By ejecting the semiconductor substrate 22 from the sputtering chamber of the apparatus into the atmosphere, oxygen is stacked on the rough TiN surface to form a TiON film 48.

In the present embodiment, the barrier metal has a double structure, so the barrier property is improved.

Next, an explanation will be made of the fourth embodiment of the present invention.

The fourth embodiment is an example of use for an anti-reflection film for preventing balation in lithography of the interconnection layer.

A high density TiN (111) crystal is formed in advance on the interconnection layer with an $Ar/N_2$=40/20 sccm. Thereafter, the ratio is continuously changed to $Ar/N_2$=40/70 sccm to form a rough TiN film and oxygen is stacked on that part to give a structure wherein only the surface portion is changed to TiON. The rough TiN film is changed to TiON just by conveyance in the apparatus. When the interlayer insulation film is formed on this, a contact hole is formed in this interlayer insulation film, and a plug of Al, W or the like is formed in the contact hole, a strong TiN is formed under the TiON, therefore the movement of the inflowing Al or the like to or from the upper layer interconnection from the lower layer interconnection through the plug along with heat treatment can be prevented.

Also, TiON having a higher anti-reflection effect than that of TiN is used as the anti-reflection film, and therefore there is the advantage that the precision of processing of the interconnections is improved.

An example wherein the method of the present invention is concretely applied to an MOS transistor will be shown next.

Figure 8A:
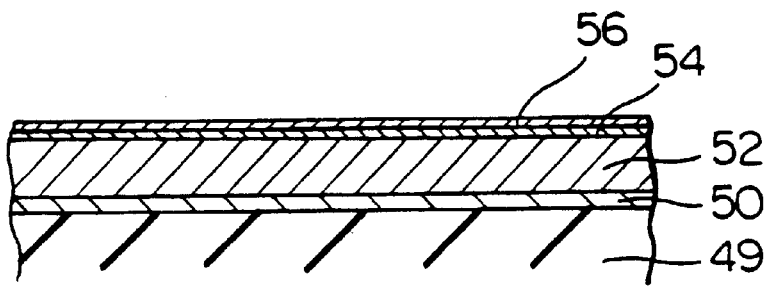
FIGS. 8A to 8C show another example of a process for producing a metal oxide semiconductor (MOS) device according to the present invention.

(a) First, as shown in FIG. 8A, the interconnection of Al/Ti is formed on the underlying substrate 49. The underlying substrate 49 is for example the lower layer interlayer insulation film.

An example of the conditions for formation of the Ti film 50 on the underlying substrate 49 will be shown next.

EXAMPLE 15

Power: 4 kW

Film formation temperature: 150° C.

Ar=100 sccm

Film thickness: 30 nm

Pressure: 0.47 Pa

An example of the conditions for formation of the Al film 52 on this Ti film 50 by sputtering will be shown next.

EXAMPLE 16

Power: 22.5 kW

Film formation temperature: 150° C.

Ar=50 sccm

Film thickness: 0.5 $\mu$m

Pressure: 0.47 Pa

Next, a TiN film 54, which becomes the barrier metal of the upper layer interconnection and becomes the anti-reflection film for the lithography, is formed on the Al film 52. An example of the conditions for forming the TiN film 54 by sputtering will be shown next.

EXAMPLE 17

Power: 5 kW

Gas $Ar/N_2$=40/20 sccm

Pressure: 0.47 Pa

Film thickness: 20 nm

Further, the ratio of the flow rates of the $Ar/N_2$ gas is continuously changed to form the TiN film on the TiN film 54 by reactive sputtering. An example of the conditions for formation of the film will be shown next.

EXAMPLE 18

Power: 5 kW

Gas $Ar/N_2$=40/70 sccm

Pressure: 0.47 Pa

Film thickness: 10 nm

By exposing the TiN film to the atmosphere in this state, oxygen is stacked on the rough TiN surface to change it to a TiON film 56. Thereafter, resist patterning and dry etching are carried out to form the Al/Ti interconnection layer. An example of the etching conditions will be shown next.

EXAMPLE 19

Gas $BCl_3/Cl_2$=60/90 sccm

Microwave power: 1000 W

RF power: 50 W

Pressure: 0.016 Pa

At this time, the TiON film 56 is formed on the interconnections, and therefore, at the time of exposure, the generation of halation is suppressed, and stable patterning becomes possible. FIG. 9 shows the antireflection effect by the TiON film. Due to the TiON film, it is possible to minimize the reflection rate with respect to light having a specific exposure wavelength, and the generation of halation at the time of exposure can be prevented. Note that, in FIG. 9, the film thickness of the TiON film was set to 300 angstroms, but the curve of FIG. 9 can be shifted to the left side along with an increase of the film thickness.

Figure 8B:
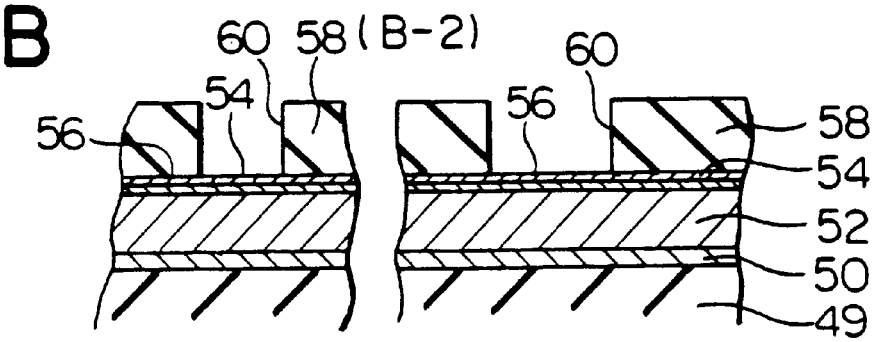

(b) Next, as shown in FIG. 8B, the interlayer insulation film 58 on the upper layer side is formed. An example of the conditions for formation of the interlayer insulation film 58 by CVD will be shown next.

EXAMPLE 20

Gas TEOS=50 sccm

Temperature: 720° C.

Pressure: 40 Pa

Film thickness: 600 nm

Next, the resist patterning is carried out to form the contact hole 60 in the interlayer insulation film 58. The dry etching conditions for forming that contact hole will be shown next.

EXAMPLE 21

Gas $C_4F_8$=50 sccm

RF power: 1200 W

Pressure: 2 Pa

In this case, it is also possible to form the contact hole 60 so that the TiON film 56 serving as the anti-reflection film is left without etching, or, as shown in FIG. 8B, it is also possible to form the contact hole 60 so that the etching is carried out up to the TiON film 56 serving as the anti-reflection film and the surface of the TiN film 54 is exposed.

Note, when considering the electrical conductivity, the latter case (FIG. 8B) is preferable and the manufacturing yield is improved.

Figure 8C:
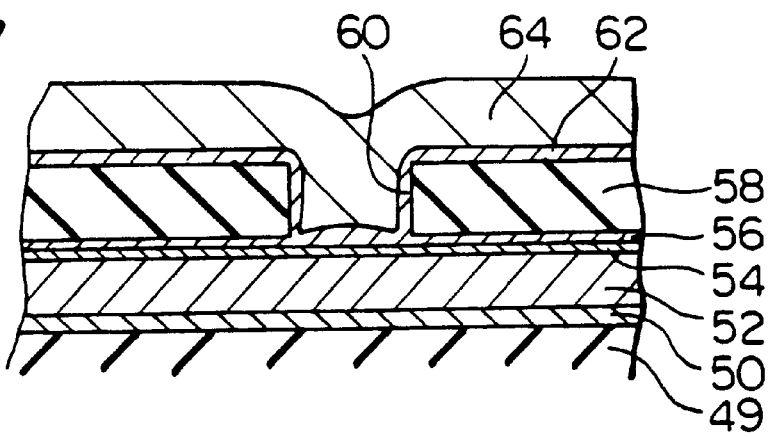

(c) Further, as shown in FIG. 8C, the Al/Ti interconnection layer is formed. The film formation conditions are omitted since they are almost the same as those described above. Next, the interconnection region is formed by resist patterning and dry etching. These conditions are also the same as those described above, and therefore no explanation is given.

In this construction, the TiN film serving as the barrier metal exists in the upper portion of the lower layer interconnection, whereby movement of Al accompanied with the reaction in the via-contact (via- con) connection portion is no longer caused in the heat treatment after this during the process since the TiN suppresses the reaction between the lower layer interconnections and the upper layer interconnections. For this reason, interconnection voids are suppressed, and an element having an improved reliability of interconnections is obtained.

Next, an explanation will be made of a fifth embodiment of the present invention.

In the fifth embodiment, the procedures are the same as those for the aforesaid fourth embodiment except that, when forming a further rough TiN film which serves as the TiON film 56 of the fourth embodiment, oxygen gas is introduced so that the TiON is continuously formed.

The present invention is not restricted to the above-described embodiments. There is no problem even if other methods are used so far as the object of the present invention can be achieved. Moreover, the film formation method can be applied even in a case where CVD other than sputtering is used. Also, in the present embodiments, the present invention was applied to a method of producing an MOS device, but the present invention is not restricted to this and can be applied also to other devices (bipolar transistors, charge-coupled devices, etc.) other than an MOS device. Moreover, it can be applied also to interconnection materials other than aluminum, such as copper and silver.

Since the Ti (002) crystal with which titanium and silicon are apt to react is formed in the contact portion, a stable ohmic-contact is obtained.

Since a TiN film having an excellent TiN construction in terms of the film quality is formed, the barrier property is increased, and the element reliability is improved.

The barrier property is further improved by the TiON/TiN construction.

Since the TiON is formed on the TiN, by using a TiON film having a higher anti-reflection effect than that of the TiN, the wave effect which is always present in photolithography can be reduced and stable interconnection processing becomes possible.

Since the anti-reflection film is formed by the TiON/Ti construction, the voids of the via-contacts are no longer generated, and the electromigration (EM) durability of the via-contacts is improved.

Since the TiN/TiN or TiON/TiN construction is basically the same as that of the conventional TiN single layer formation method, no great change is made in the process of fabrication and the amount of capital investment can be kept down.

What is claimed is:

1. A method of producing a semiconductor device having at least a compound film containing a nitrogen, wherein said compound film containing nitrogen is formed under conditions where the ratio of the flow rates of the nitrogen with respect to an inert gas is 0.125 to 1.0, wherein a step of electrically connecting an interconnection layer and semiconductor of said semiconductor device through a contact portion is included and at least said compound film containing nitrogen is formed as an underlying film arranged between said interconnection layer and semiconductor, wherein as said underlying film, a Ti film in contact with the semiconductor, a first TiN film laminated on this Ti film, and a second TiN film which is laminated on this first TiN film and has different characteristics from those of the first TiN film are formed, and wherein the ratio of the flow rates of the nitrogen gas with respect to the inert gas is changed when continuously forming said first TiN film and said second TiN film by the reactive sputtering.

2. A method of producing a semiconductor device as set forth in claim 1, wherein said compound film containing the nitrogen described before is formed by reactive sputtering or chemical vapor deposition.

3. A method of producing a semiconductor device as set forth in claim 1, wherein said compound film containing nitrogen is TiN, WN, MoN, ZrN, HfN, BN, CN or oxides of any of the same.

4. A method of producing a semiconductor device as set forth in claim 1, wherein said inert gas is an argon gas.

5. A method of producing a semiconductor device as set forth in claim 1, wherein said compound film containing nitrogen acts as a barrier film in said contact portion.

6. A method of producing a semiconductor device as set forth in claim. 1, wherein as said underlying film, a Ti film in contact with the semiconductor and a TiN film laminated on this Ti film are formed.

7. A method of producing a semiconductor device as set forth in claim 1, wherein the ratio of the flow rates of the nitrogen gas with respect to the inert gas when forming said first TiN film is controlled to 0.7 or less and the ratio of the flow rates of the nitrogen gas with respect to the inert gas when forming said second TiN film is controlled to 0.75 or more.

8. A method of producing a semiconductor device as set forth in claim 1, wherein as said underlying film, the Ti film in contact with the semiconductor and a TiON film laminated on this Ti film are formed.

9. A method of producing a semiconductor device as set forth in claim 8, wherein said TiON film is formed by forming said TiN film by the reactive sputtering by controlling the ratio of the flow rates of the nitrogen gas with respect to the inert gas to 1.0 to 0.125 and then changing the ratio of the flow rates of the nitrogen gas with respect to the inert gas to the larger side to form rough TiN film, then exposing this rough TiN film to the atmosphere or a low vacuum atmosphere having a divided pressure of oxygen of 0.1 Pa or more so as to change the rough TiN film to a TiON film.

10. A method of producing a semiconductor device as set forth in claim 8, wherein said TiON film is formed by reactive sputtering using a nitrogen gas, oxygen gas, and inert gas.

11. A method of producing a semiconductor device as set forth in claim 1, wherein the lower interconnection layer and the upper interconnection layer of the semiconductor device are electrically connected through the contact portion, laminate films are laminated on said lower interconnection layer, and said laminate films contain at least said compound film containing nitrogen.

12. A method of producing a semiconductor devices as set forth in claim 11, wherein the film positioned in the uppermost layer among said laminate films acts as the anti-reflection film when subjecting said lower interconnection layer to photolithography.

13. A method of producing a semiconductor devices as set forth in claim 11, wherein as said laminate film, a TiN film in contact with the lower interconnection layer, and a TiON film laminated on said TiN film are formed.

14. A method of producing a semiconductor device as set forth in claim 13, wherein said TiON film is formed by forming said TiN film by reactive sputtering by controlling the ratio of the flow rates of the nitrogen gas with respect to the inert gas to 1.0 to 0.12, and then changing the ratio of the flow rates of the nitrogen gas with respect to the inert gas to the larger side to form a rough TiN film and exposing this rough TiN film to the atmosphere or a low vacuum atmosphere having a divided pressure of oxygen of 0.1 Pa or more so as to change the rough TiN film to a TiON film.

15. A method of producing a semiconductor device as set forth in claim 13, wherein said TiON film is formed by reactive sputtering using a nitrogen gas, oxygen gas, and inert gas.

16. A method of producing a semiconductor devices as set forth in claim 11, wherein as said laminate film, a Ti film in contact with the lower interconnection layer, a TiN film laminated on said Ti film, and a TiON film laminated on said TiN film are formed.

17. A method of producing a semiconductor devices as set forth in claim 11, wherein as said laminate film, a Ti film in contact with the lower interconnection layer, a first TiN film laminated on said Ti film, and a second TiN film which is laminated on said first TiN film and have different characteristics from those of said first TiN film are formed.

18. A method of producing a semiconductor device as set forth in claim 17, wherein when continuously forming said first TiN film and second TiN film by reactive sputtering, the ratio of the flow rates of the nitrogen gas with respect to the inert gas is changed.

19. A method of producing a semiconductor device as set forth in claim 18, wherein the ratio of the flow rates of the nitrogen gas with respect to the inert gas when forming said first TiN film is controlled to 0.7 or less and the ratio of the flow rates of the nitrogen gas with respect to the inert gas when forming said second TiN film is controlled to 0.75 or more.

20. A method of producing a semiconductor device as set forth in claim 1, wherein said compound film containing nitrogen is formed by reactive sputtering using a collimater.

* * * * *